United States Patent
Kim et al.

(10) Patent No.: US 8,253,232 B2
(45) Date of Patent: Aug. 28, 2012

(54) PACKAGE ON PACKAGE HAVING A CONDUCTIVE POST WITH HEIGHT LOWER THAN AN UPPER SURFACE OF AN ENCAPSULATION LAYER TO PREVENT CIRCUIT PATTERN LIFT DEFECT AND METHOD OF FABRICATING THE SAME

(75) Inventors: Kyung-man Kim, Hwaseong-si (KR); In-ku Kang, Suwon-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 182 days.

(21) Appl. No.: 12/692,699

(22) Filed: Jan. 25, 2010

(65) Prior Publication Data

US 2010/0283140 A1    Nov. 11, 2010

(30) Foreign Application Priority Data

May 8, 2009  (KR) .................. 10-2009-0040290

(51) Int. Cl.
*H01L 23/498*  (2006.01)
*H01L 21/50*  (2006.01)

(52) U.S. Cl. ......... 257/686; 257/E23.069; 257/E21.508; 257/777; 257/723; 257/784; 257/786; 257/737; 257/738; 257/778

(58) Field of Classification Search .................. 257/686, 257/777, E23.069, E21.508, 723, 784, 786, 257/737, 738, 778

See application file for complete search history.

(56) References Cited

U.S. PATENT DOCUMENTS

| | | | | |
|---|---|---|---|---|
| 5,872,700 | A  * | 2/1999 | Collander | 361/760 |
| 6,177,725 | B1 * | 1/2001 | Yamada et al. | 257/704 |
| 6,376,904 | B1 * | 4/2002 | Haba et al. | 257/686 |
| 6,555,917 | B1 * | 4/2003 | Heo | 257/777 |
| 6,933,613 | B2 * | 8/2005 | Akashi | 257/778 |
| 7,391,105 | B2 * | 6/2008 | Yeom | 257/686 |
| 7,528,491 | B2 * | 5/2009 | Kirby et al. | 257/774 |
| 7,808,112 | B2 * | 10/2010 | Boon | 257/777 |
| 7,863,109 | B2 * | 1/2011 | Chow et al. | 438/126 |
| 7,868,455 | B2 * | 1/2011 | Chen | 257/750 |
| 7,911,070 | B2 * | 3/2011 | Pagaila et al. | 257/787 |
| 7,939,924 | B2 * | 5/2011 | Yoo | 257/686 |
| 2005/0133932 | A1 * | 6/2005 | Pohl et al. | 257/777 |
| 2008/0105962 | A1 | 5/2008 | Lee et al. | |

FOREIGN PATENT DOCUMENTS

| | | |
|---|---|---|
| KR | 20050027384 | 3/2005 |
| KR | 100842915 | 6/2008 |

* cited by examiner

*Primary Examiner* — A O Williams

(74) *Attorney, Agent, or Firm* — Stanzione & Kim, LLP

(57) ABSTRACT

A package on package includes a lower semiconductor package including a plurality of stacked semiconductor chips, a connection portion including an electrically-conductive lead having a height lower than that of an encapsulation member, and an upper semiconductor package connected to the connection portion of the lower semiconductor package via a solder ball in a fan-in structure.

10 Claims, 16 Drawing Sheets

PACKAGE ON PACKAGE HAVING A CONDUCTIVE POST WITH HEIGHT LOWER THAN AN UPPER SURFACE OF AN ENCAPSULATION LAYER TO PREVENT CIRCUIT PATTERN LIFT DEFECT AND METHOD OF FABRICATING THE SAME

CROSS-REFERENCE TO RELATED APPLICATIONS

This application claims the benefit of Korean Patent Application No. 10-2009-0040290, filed on May 8, 2009, in the Korean Intellectual Property Office, the disclosure of which is incorporated by reference herein in its entirety.

BACKGROUND

1. Field of the Invention

The present general inventive concept relates to an advanced semiconductor package and a fabrication method thereof, and more particularly, to a package on package (POP) in which two semiconductor packages are connected vertically, and a method of fabricating the POP.

2. Description of the Related Art

As the size of a portable electronic device decreases, the size, thickness, and weight of semiconductor packages are decreasing as well. Conventionally, a semiconductor package having a single function has been mounted on a main printed circuit board (PCB) of a portable electronic device. Recently, an advanced semiconductor package having two or more functions may be mounted on the main PCB.

Integrated semiconductor packages such as a system in package (SIP), a multi chip package (MCP), and a package on package (POP) are typical examples of the advanced semiconductor packages. Of the integrated semiconductor packages, the POP incorporates two semiconductor packages into one after completing assembly and an electrical test of each semiconductor package. Since semiconductor packages are assembled in a defect-free state after the electrical functions of each semiconductor package have been tested, electrical defects generated after the semiconductor packages are assembled in a POP state may be reduced. Also, semiconductor packages having different functions may be incorporated into a single semiconductor package.

SUMMARY

The present general inventive concept provides a package on package (POP) with a decreased height of a semiconductor package and an increased reliability in the solder junction so that a circuit pattern lift defect may be prevented.

Additional aspects and utilities of the present general inventive concept will be set forth in part in the description which follows and, in part, will be obvious from the description, or may be learned by practice of the general inventive concept.

Features and/or utilities of the present general inventive concept may be realized by a package on package including a lower semiconductor package having a plurality of stacked semiconductor chips, and a connection portion including a copper post having a height lower than that of an encapsulation member. A part of the encapsulation member on an upper surface of the lower semiconductor package may be removed to form the connection portion. The package-on-package may further include an upper semiconductor package connected to the connection portion of the lower semiconductor package via a first solder ball in a fan-in structure.

The lower semiconductor package may include a substrate, a plurality of semiconductor chips stacked on the substrate, a pad redistribution pattern formed on a surface of a semiconductor chip located at the top of the stacked semiconductor chips, a copper post formed on a connection terminal of the pad redistribution pattern, a wire connecting each of the plurality of semiconductor chips and the substrate, the encapsulation member encapsulating the upper surface of the substrate, the plurality of semiconductor chips, the copper post, and a second solder ball attached to a lower surface of the substrate.

The plurality of semiconductor chips may be stacked on the substrate in a first direction so that each semiconductor chip is offset from each adjacent semiconductor chip in a second direction perpendicular to the first direction. The lower semiconductor package may further include a passive device mounted to the substrate and connected to the substrate by a wire.

Solder may be plated on at least one of a side surface and an upper surface of the copper post of the connection portion. The center portion of the copper post of the connection portion may be hollow.

The removing of a part of the encapsulation member may be to expose only a part or the whole of the copper post.

A part of the solder ball of the upper semiconductor package may be connected to the copper post of the connection portion at a height lower than that of the encapsulation member of the lower semiconductor package. The package on package may further include an underfill filling a space between the lower semiconductor package and the upper semiconductor package.

Features and/or utilities of the present general inventive concept may also be realized by a method of fabricating a package on package to prevent a circuit pattern lift defect, the method including preparing a lower semiconductor package having a plurality of stacked semiconductor chips, a pad redistribution pattern formed on a top semiconductor chip, and a copper post is formed on a connection terminal of the pad redistribution pattern, forming a connection portion by removing a part of an encapsulation member on the lower semiconductor package to expose the copper post, and coupling a first solder ball of an upper semiconductor package including a plurality of stacked semiconductor chips, to the copper post of the connection portion of the lower semiconductor package, in a fan-in structure.

The lower semiconductor package may be fabricated by a method including preparing a substrate for a semiconductor package, stacking a plurality of semiconductor chips on the substrate to be offset from one another, stacking an upper-most semiconductor chip having a pad redistribution pattern and a copper post on an upper-most semiconductor chip of the stacked plurality of semiconductor chips, connecting the semiconductor chip and the substrate using a wire, encapsulating an upper portion of the substrate, the semiconductor chip, and the wire using an encapsulation member, and attaching a second solder ball to a lower portion of the substrate.

In the exposing of the copper post by removing a part of the encapsulation member on the lower semiconductor package, the encapsulation member may be removed such that the copper post is completely or partially exposed.

In the semiconductor chip in which the pad redistribution pattern and the copper post are formed on a top portion thereof, solder may be plated on a surface of the copper post.

The solder may be plated on both of a side surface and an upper surface of the copper post or only on the upper surface of the copper post.

In the exposing of the copper post by removing a part of the encapsulation member on the lower semiconductor package, the copper post may be exposed by laser etching or by dry or wet etching using a mask. The exposing of the copper post by removing a part of the encapsulation member on the lower semiconductor package may include attaching a release film on the copper post after the copper post is formed, encapsulating the lower semiconductor package, to which the release film is attached, by using an encapsulation member, and removing the release film to expose the copper post after the encapsulating using the encapsulation member is completed.

A position of the solder ball of the upper semiconductor package coupled to the copper post may be lower than that of the encapsulation member of the lower semiconductor package.

Features and/or utilities of the present general inventive concept may be realized by a semiconductor package including at least one semiconductor chip stack, an encapsulation layer covering an upper surface of the semiconductor chip stack, the encapsulation layer having at least one recess on an upper surface corresponding to an upper surface of the semiconductor chip stack, and at least one electrically conductive lead electrically connected to the semiconductor chip stack and protruding from the encapsulation layer at the recess.

The at least one semiconductor chip stack may include a plurality of semiconductor chips stacked one atop another.

The semiconductor chip stack may include at least one redistribution layer stacked on an upper surface of an uppermost semiconductor chip of the semiconductor chip stack, and the electrically conductive lead may be electrically connected to the redistribution layer.

The semiconductor package may further include an upper semiconductor package stacked on the semiconductor chip stack and electrically connected to the electrically conductive lead.

The electrically conductive lead may have a height lower than an upper surface of the encapsulation layer. Alternatively, the electrically conductive lead may have a height higher than an upper surface of the encapsulation layer.

The electrically conductive lead may have a cross-sectional shape of one of a cross, a pentagon, a circle, an oval, or a rectangle.

The electrically conductive lead may have a hollow center.

A surface of the electrically conductive lead may be coated with a layer of solder.

The electrically conductive lead may include a first end contacting an upper surface of the semiconductor stack and a second end opposite the first end and extending away from the surface of the upper surface semiconductor stack, and the encapsulation layer may contact a base of the conductive lead adjacent to the first end of the conductive lead. Alternatively, the encapsulation layer may not contact the electrically conductive lead.

The at least one semiconductor chip stack may include a substrate, a plurality of stacked semiconductor chips, each semiconductor chip offset from each adjacent semiconductor chip, the lower-most semiconductor chip of the stacked semiconductor chips mounted on the substrate, and at least one wire connecting each semiconductor chip to each adjacent semiconductor chip.

The encapsulation layer encloses each of the plurality of semiconductor chips and the at least one wire.

Features and/or utilities of the present general inventive concept may also be realized by a method of forming a semiconductor package, the method including forming an electrically conductive lead to protrude from an upper surface of a semiconductor chip stack, forming an encapsulation layer to cover the upper surface of the semiconductor chip stack, and removing the encapsulation layer surrounding the lead to form a recess in the encapsulation layer.

The method may further include forming a layer of solder on a surface of the electrically conductive lead.

The method may further include mounting an upper semiconductor package to the semiconductor chip stack, the upper semiconductor package having at least one solder ball to correspond to the recess in the encapsulation layer, the solder ball electrically connecting to the electrically conductive lead.

Features and/or utilities of the present general inventive concept may also be realized by a computing device may include a processing unit including a processor and a logic unit and a function unit including at least one memory chip. The computing device may further include a semiconductor package. The semiconductor package may include at least one semiconductor chip stack, an encapsulation layer covering an upper surface of the semiconductor chip stack, the encapsulation layer having at least one recess on an upper surface corresponding to an upper surface of the semiconductor chip stack, and at least one electrically conductive lead electrically connected to the semiconductor chip stack and protruding from the encapsulation layer at the recess. At least one of the processor, logic unit, and memory chip is a semiconductor chip in the at least one semiconductor chip stack.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
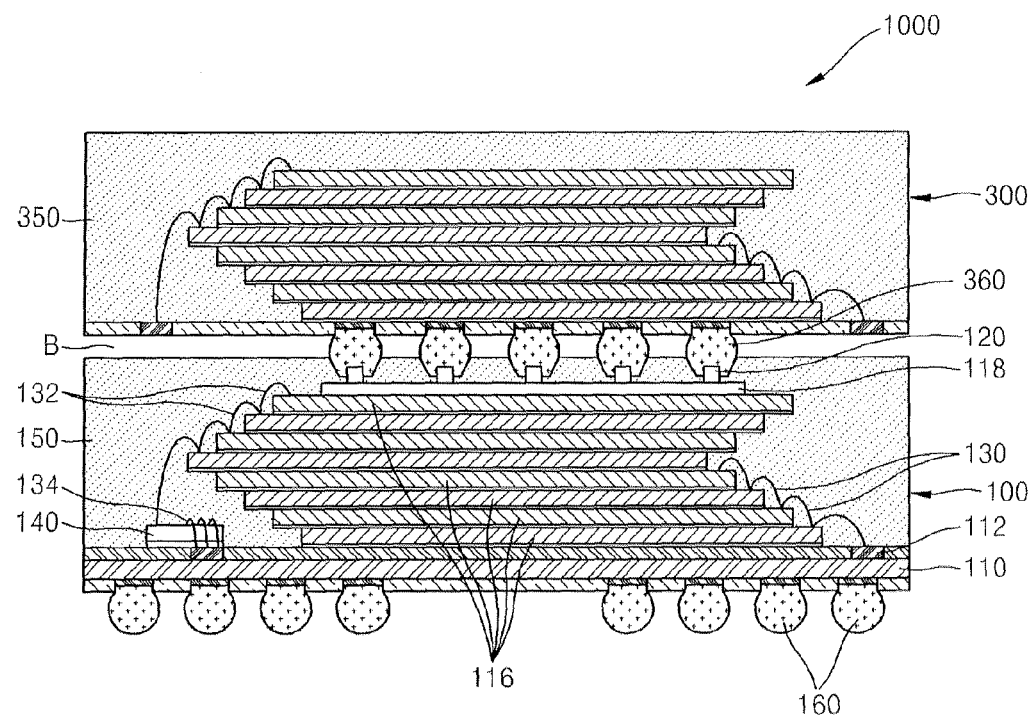
FIG. 1 is a cross-sectional view illustrating a package-on-package to prevent circuit pattern lift defects according to an exemplary embodiment of the present general inventive concept.

Hereinafter, exemplary embodiments of the present general inventive concept are described in detail with reference to the accompanying drawings. However, the present inventive concept is not limited thereto and it will be understood that various changes in form and details may be made therein without departing from the spirit and scope of the following claims. That is, descriptions on particular structures or functions may be presented merely for explaining exemplary embodiments of the present inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a cross-sectional view illustrating a package on package (POP) 1000 structure to prevent a circuit pattern lift defect according to an exemplary embodiment of the present general inventive concept. The package-on-package 1000 includes a lower semiconductor package 100 having a plurality of stacked semiconductor chips 116, an electrically-conductive lead 120 that may be exposed from the encapsulation member or layer 150 by removing a part of an encapsulation member 150 on an upper surface of the lower semiconductor package 100. The electrically-conductive lead 120 may be a copper post 120, for example. Alternatively, the electrically-conductive lead 120 may be a gold post, silver post, tin post, an alloy of any one of a copper, gold, silver, and tin, or a post made of any other appropriate conductive material. The electrically-conductive lead 120 may have a height lower than that of the encapsulation member 150. An upper semiconductor package 300 may be connected to the electrically-conductive lead 120 of the lower semiconductor package 100 via a solder ball 360 in a fan-in structure. A gap B between the lower semiconductor package 100 and the upper semiconductor package 300 may be filled with underfill such as epoxy.

The package-on-package 1000 that prevents a circuit pattern lift defect may employ a fan-in structure to connect the upper semiconductor package 300 and the lower semiconductor package 100. Thus, a connection defect between the upper and lower semiconductor packages 300 and 100 generated due to warping defects of the upper and lower semiconductor packages 300 and 100 may be prevented.

The fan-in structure is a structure in which the connection between the upper and lower semiconductor packages 300 and 100 is made not at an upper surface of the lower semiconductor package 100, but inward from the upper surface, toward a central portion where semiconductor chips 116 are located. A structure in which the connection between the upper and lower semiconductor packages 300 and 100 is made at the edge of the lower semiconductor package 100 is referred to as a fan-out structure. When a slight warping defect is generated in substrates of the upper and lower semiconductor packages 300 and 100, the solder ball 360 of the upper semiconductor package may not connect to the substrate of the lower semiconductor package 100, that is, a critical connection defect may be generated. The package-on-package 1000 having the fan-in structure according to the present exemplary embodiment may prevent the above connection defect.

In the package-on-package 1000 according to the present exemplary embodiment a pad redistribution pattern 118 may be formed on the top semiconductor chip of the lower semiconductor package 100 and the electrically-conductive lead, or copper post, 120 may be formed at a connection terminal of the pad redistribution pattern 118. The solder ball 360 of the upper semiconductor package 300 may be connected to the electrically-conductive lead 120 by descending below an upper surface of the encapsulation member 150 of the lower semiconductor package 100

Accordingly, the overall height of the package-on-package 1000 decreases so that the semiconductor package may be made more compact. Also, the interval between the solder balls 360 may be reduced in to the decrease of the height of the solder ball 360 of the semiconductor package 300. Due to these advantages, the solder ball 360 may be more freely arranged in the step of designing the package-on-package 1000.

After being fabricated, most semiconductor packages pass a variety of reliability tests to check whether the functions of the semiconductor package work properly in the extreme environment. One of the reliability tests may be a temperature test to check the operational state of a semiconductor package according to a change in temperature. According to the temperature test, the package-on-package 1000 is placed at a temperature of −25° C. for 10 minutes and then at a high temperature of 125° C. for 10 minutes, and the test is repeated to check the reliability of the semiconductor package. A one-time switch between −25° C. and 125° C. is defined as one cycle. After the test is repeated for 1000 cycles, the electrical and/or physical status of the package-on-package 1000 is checked.

When the solder ball 360 of the upper semiconductor package 300 and the top semiconductor chip of the lower semiconductor package 100 are connected directly without using the electrically-conductive lead 120, a circuit pattern (not shown) formed on the top semiconductor chip may be lifted, or may peel, due to a difference in the coefficient of thermal expansion (CTE) between the solder ball 360 and the semiconductor chip. Leakage current may be generated from the lifted portion. In a severe case, a circuit may be disconnected which is a critical defect.

However, since the electrically-conductive lead 120 works as a buffer to absorb the difference in the CTE between the solder ball 360 of the upper semiconductor package 300 and the top semiconductor chip of the lower semiconductor package 100, the package-on-package 1000 may distribute stress due to the difference in the coefficient of thermal expansion. Also, since the solder ball 360 of the upper semiconductor package 300 descends below the upper surface of the encapsulation member 150 of the lower semiconductor package 100, the encapsulation member 150 may absorb thermal stress generated due to the difference in the CTE so that solder junction reliability (SJR) of a package-on-package structure may be improved.

The upper and lower semiconductor packages 300, 100 may be separated by a gap B defined by the solder balls or connectors 360. Like the lower semiconductor package 100, the upper semiconductor package 300 may include an encapsulation layer or member 350 to surround the semiconductor chips and wires of the upper semiconductor package, which are configured similarly to those of the lower semiconductor package 100. The lower semiconductor package may also include connectors or solder balls 160 to connect the package-on-package to another electronic device (not shown).

Figure 2A:
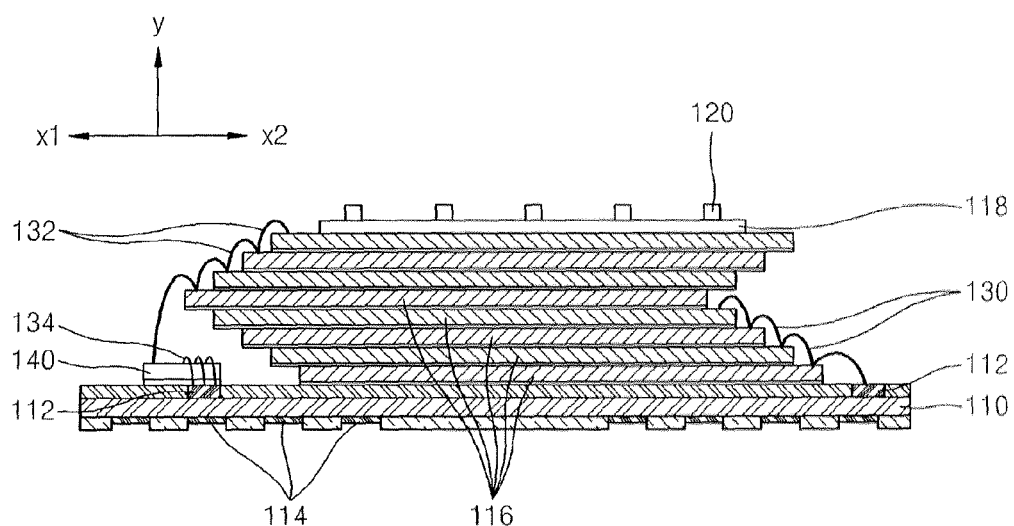
FIGS. 2A and 2B are cross-sectional views illustrating a method of stacking semiconductor chips in a lower semiconductor package according to an exemplary embodiment of the present general inventive concept.
Figure 2B:
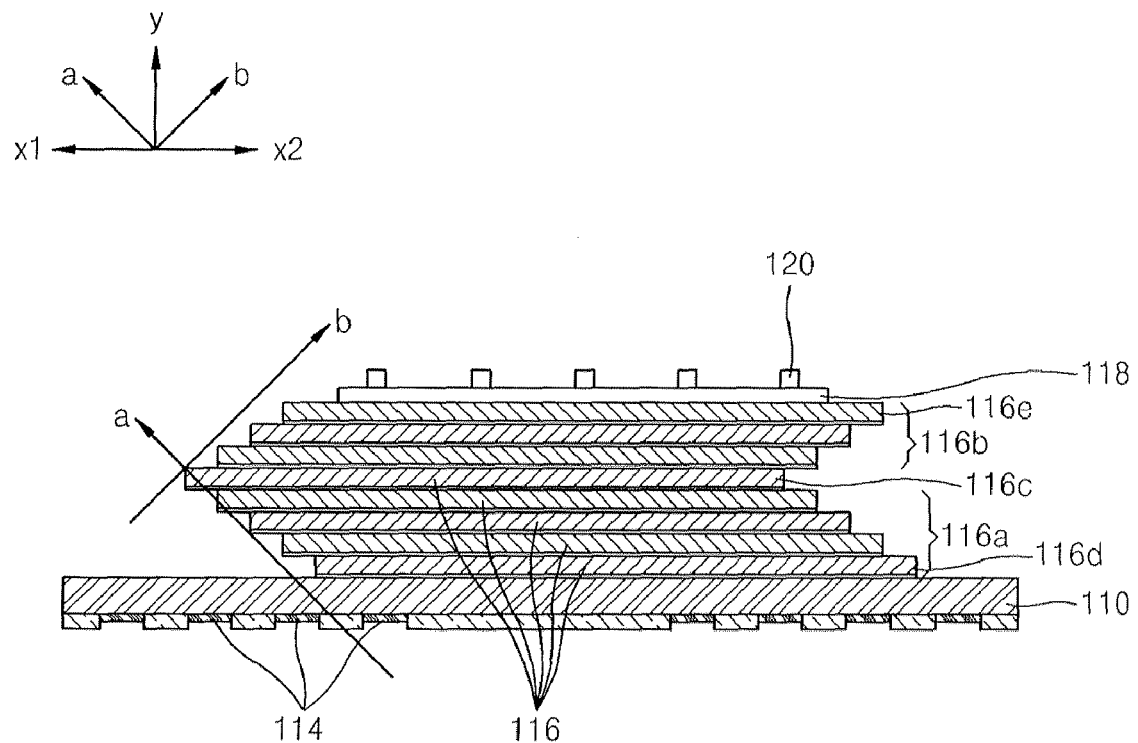

FIGS. 2A and 2B are cross-sectional views illustrating stacked semiconductor chips in a lower semiconductor package according to an exemplary embodiment of the present general inventive concept. Referring to FIGS. 1, 2A, and 2B, a substrate 110 is provided and may be a printed circuit board. A chip adhesion portion on which a semiconductor chip 116 may be mounted is provided on an upper surface of the substrate 110. A bond finger 112 may be formed along the edge of the chip adhesion portion. Also, a solder ball pad 114 is provided on a lower surface of the substrate 110.

The bottom-most semiconductor chip 116d may be mounted on the chip adhesion portion of the substrate 110. Other semiconductor chips 116 may be mounted on the bottom-most semiconductor chip 116 in a first direction y and may be offset from the bottom-most semiconductor chip in a second direction x1, x2 perpendicular to the first direction. As illustrated in FIG. 2B, the lower semiconductor chips 116a may be offset from adjacent semiconductor chips 116a in a first direction x1 to form a stair shape, and the upper semiconductor chips 116b may be offset from adjacent semiconductor chips 116b in a second direction x2 opposite the first direction. Thus, the lower semiconductor chips 116a are offset from one another to form a stair shape in a direction a generally between directions x1 and y, and the upper semiconductor chips 116b may be offset from one another to form a stair shape in a direction b generally between the directions x2 and y.

The semiconductor chip stack may include a center semiconductor chip 116c, and the semiconductor chips below the center semiconductor chip 116c may be the lower semiconductor chips 116a, while the semiconductor chips above the center semiconductor chip 116c may be the upper semiconductor chips 116b. While the center semiconductor chip 116c is located between the lower and upper semiconductor chips 116a, 116b, it need not be at the center point of the stack in a y direction. For example, the lower semiconductor chips 116a may include three semiconductor chips 116a while the upper semiconductor chips 116b include only one semiconductor chip 116b.

The upper-most semiconductor chip 116e may include a pad redistribution pattern 118, or a pad redistribution pattern 118 may be formed on or mounted on the upper-most semiconductor chip 116e. The electrically-conductive lead 120 may be formed on a connection terminal of the pad redistribution pattern 118. A passive device 140 may also be mounted on the substrate 110. For example, resistors, capacitors, and inductors may be mounted on the substrate 110 and one or more of the stacked semiconductors 116 may be connected to the passive devices 140.

The lower semiconductor chips 116a may be connected to the bond finger 112 of the substrate 110 via a first wire 130. The upper semiconductor chips 116b may be connected to the bond finger 112 of the substrate 110 via a second wire 132. The passive device 140 may be connected to the bond finger 112 of the substrate 110 via a third wire 134.

Figure 3:
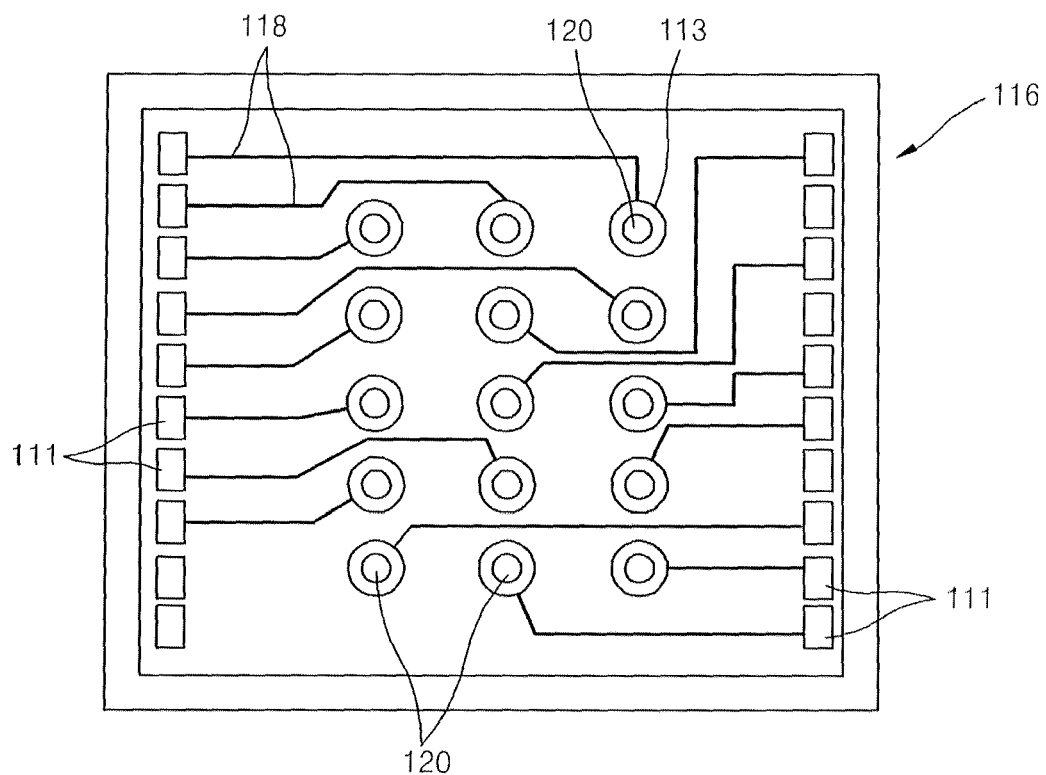
FIGS. 3-5 are plan views illustrating the shapes of the top semiconductor chip in the lower semiconductor package according to an exemplary embodiment of the present general inventive concept.
Figure 4:
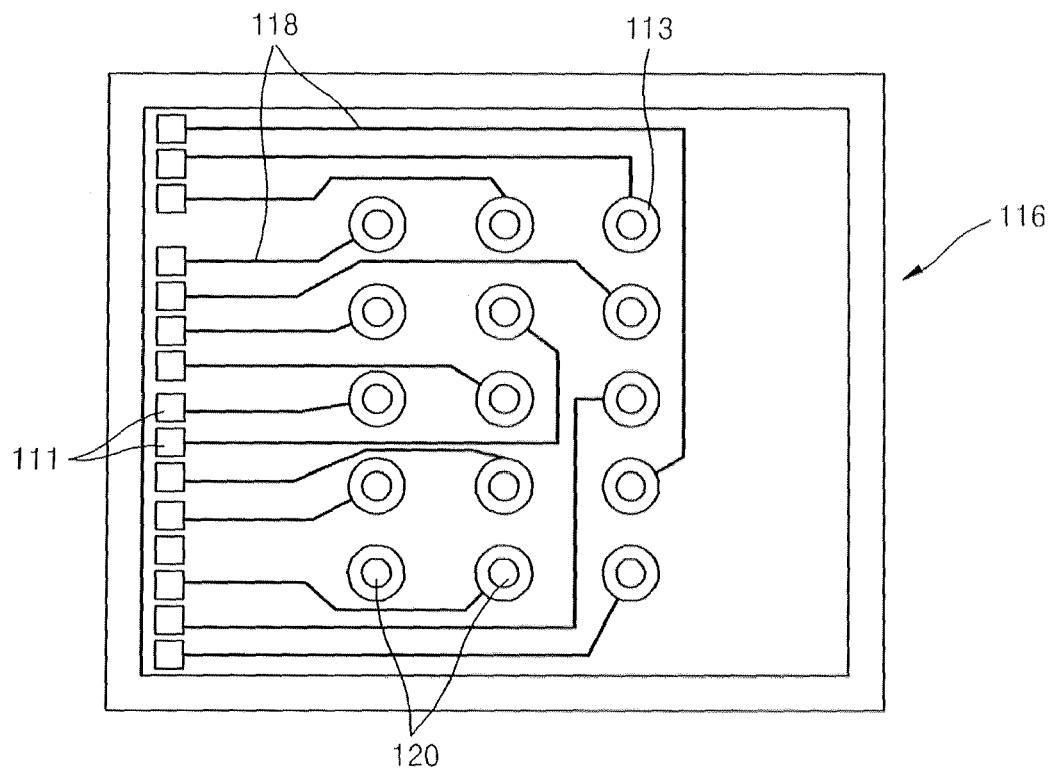
Figure 5:
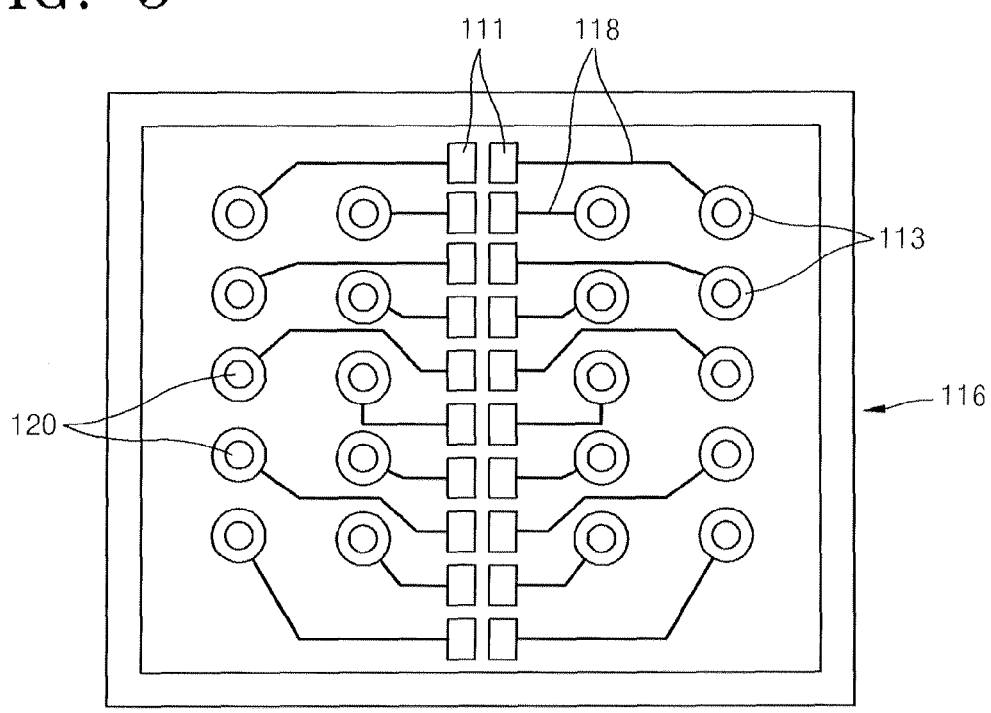

FIGS. 3-5 are plan views illustrating the shapes of the top semiconductor chip in the lower semiconductor package according to an exemplary embodiment of the present general inventive concept. The pad redistribution pattern 118 may be formed on the upper-most semiconductor chip 116 located farthest from the substrate 110. The pad redistribution pattern 118 may be formed directly in or on the upper-most semiconductor chip 116, or it may be formed on or in a layer directly connected to the upper-most surface of the upper-most semiconductor chip 116. The pad redistribution pattern 118 may be a circuit pattern electrically connecting a bond pad 111 formed on the semiconductor chip 116 to a connection terminal 113. The electrically-conductive lead 120 may be formed on the connection terminal 113.

The bond pads 111 on the semiconductor chip 116 may be formed in two rows along the edge of the semiconductor chip 116 as illustrated in FIG. 3, in a row at one side of the semiconductor chip 116 as illustrated in FIG. 4, or in two rows at the center portion of the semiconductor chip 116 as illustrated in FIG. 5.

FIGS. 6A, 6B, 6C, and 6D are plan views illustrating different shapes of the electrically-conductive lead 120 according to an exemplary embodiment of the present general inventive concept.

Figure 6A:
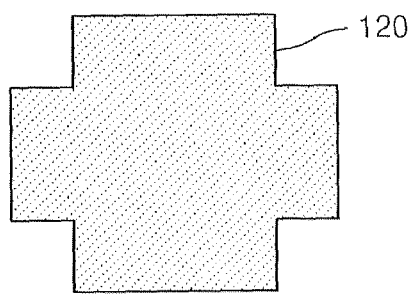
FIGS. 6A, 6B, 6C, and 6D are plan views illustrating the shapes of a copper post formed on the top semiconductor chip in the lower semiconductor package according to an exemplary embodiment of the present general inventive concept.
Figure 6B:
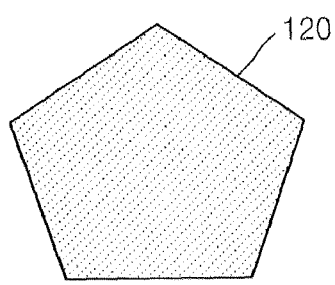
Figure 6C:
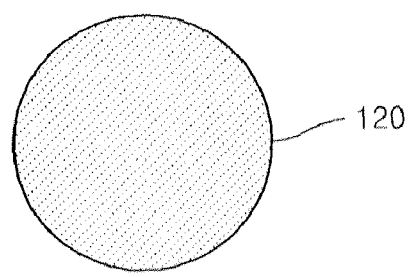
Figure 6D:
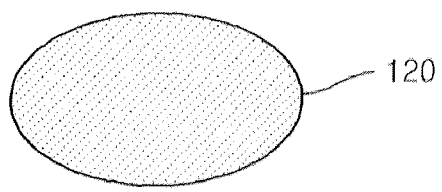
Figure 7A:
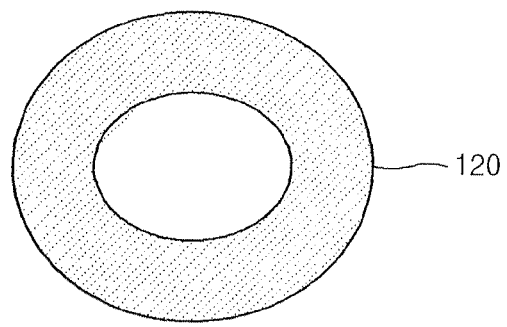
FIGS. 7A and 7B are plan views illustrating the modified shapes of the copper post formed on the top semiconductor chip in the lower semiconductor package according to an exemplary embodiment of the present general inventive concept.
Figure 7B:
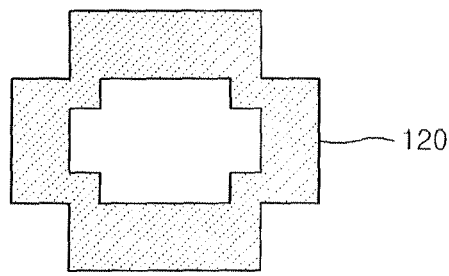

The electrically-conductive lead 120 may have a variety of shapes such as a cross (FIG. 6A), a polygon (FIG. 6B), a circle (FIG. 6C), or an oval (FIG. 6D). In addition, as illustrated in FIGS. 7A and 7B, the electrically-conductive lead 120 may be hollow. For example, FIG. 7A illustrates a hollow oval connection portion 120 and FIG. 7B illustrates a hollow cross-shaped connection portion 120. When the electrically-conductive lead 120 is hollow, the thermal stress due to the difference in the coefficient of thermal expansion between the solder ball 360 and the top semiconductor chip 116 may be more easily absorbed.

Figure 14:
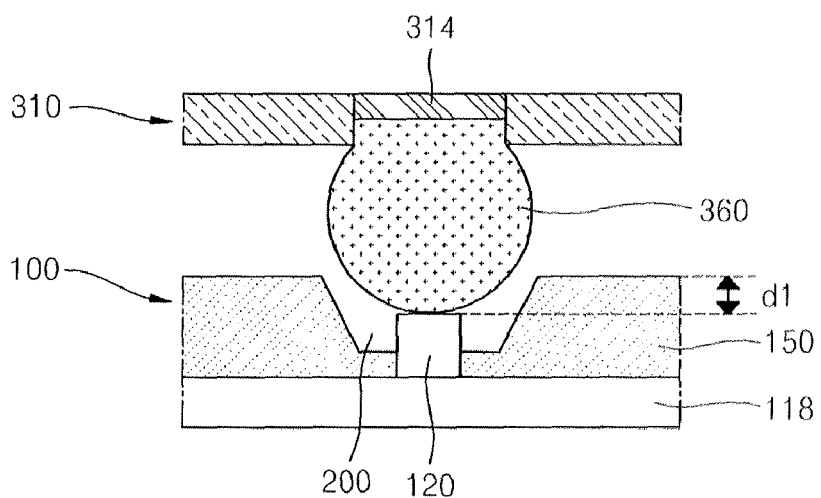

As illustrated in FIGS. 14 and 15A-15D, the electrically-conductive lead 120 may be coated with a solder layer 122a, 122b. The solder may be applied to the electrically-conductive lead 120 via an electroplating method, for example. The solder layer 122a may be located on both the sides and the top of the electrically-conductive lead 120, as shown in FIG. 14, or the solder layer 122b may be located only on the upper surface of the electrically-conductive lead 120, as illustrated in FIG. 15. Alternatively, as illustrated in FIG. 16, the electrically-conductive lead 120 may not be coated with a solder layer.

Figure 8:
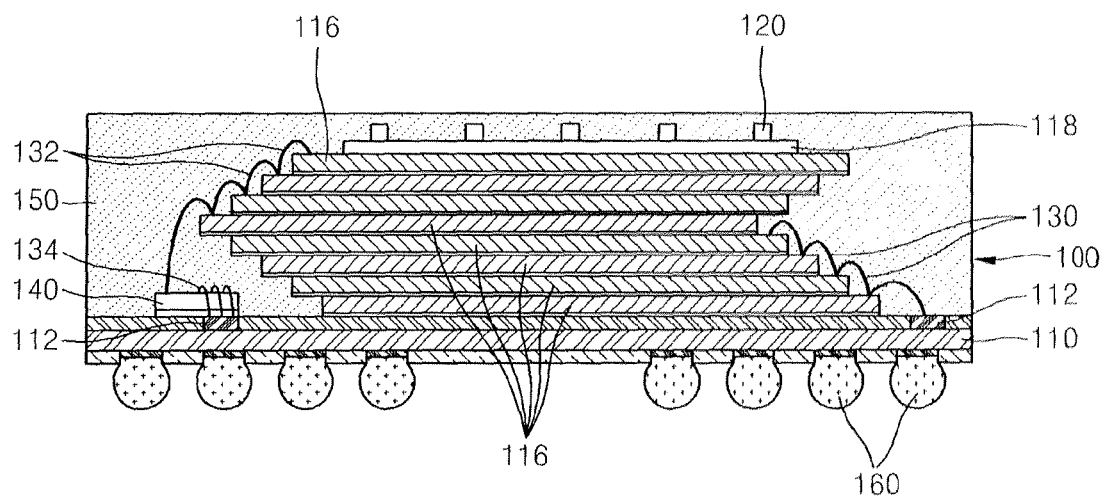
FIG. 8 is a cross-sectional view illustrating the lower semiconductor package according to an exemplary embodiment of the present general inventive concept, after a molding process is completed.

FIG. 8 is a cross-sectional view illustrating the lower semiconductor package according to an exemplary embodiment of the present general inventive concept, after a molding process is completed. The upper surface of the substrate 110, the semiconductor chip 116, the wires 130, 132, and 134, the pad redistribution pattern 118, and the electrically-conductive lead 120 may be completely encapsulated using the encapsulation member 150. The encapsulation layer or member 150 may be an epoxy mold compound (EMC), for example. The encapsulation member 150 is molded to a thickness enough to completely cover the electrically-conductive lead 120.

Figure 9:
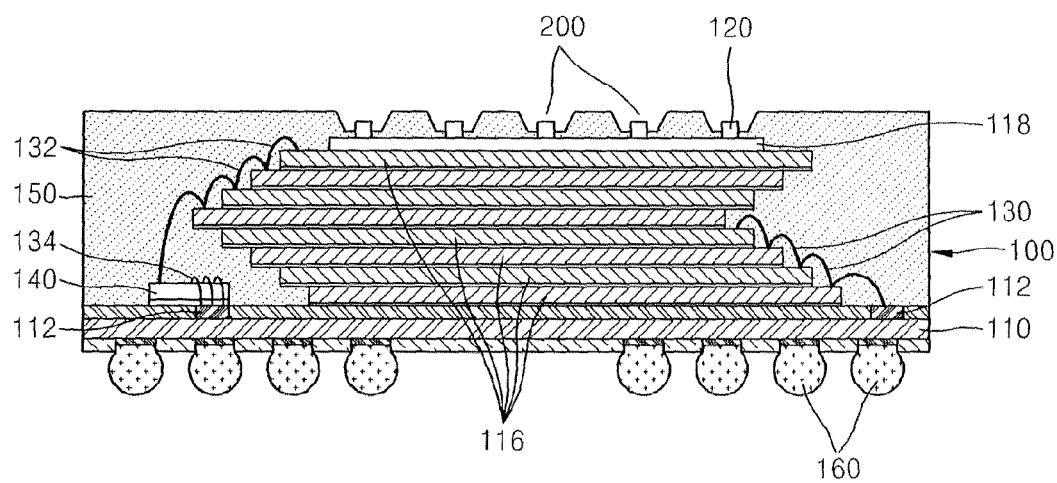
FIG. 9 is a cross-sectional view illustrating the lower semiconductor package according to an exemplary embodiment of the present general inventive concept, in which a connection portion is formed by an etch process.

FIG. 9 is a cross-sectional view illustrating the lower semiconductor package according to an exemplary embodiment of the present general inventive concept, in which the connection portion is formed by an etch process to expose the electrically-conductive lead 120. In the etch process, a part of the encapsulation member 150 is removed using laser to form a recess that exposes the electrically-conductive lead 120. In addition, a part of the encapsulation member 150 may be removed by a dry etch or wet etch process to form the connection portion 200 to expose the electrically-conductive lead 120.

If the electrically-conductive lead 120 has not been coated with solder previous to the etch process, or the encapsulation layer 150 removal process, solder may be coated onto the electrically-conductive lead after the connection portion 200 is formed. The solder may be coated only on the upper surface of the electrically-conductive lead 120 or on both of the upper and side surfaces of the electrically-conductive lead 120.

Figure 10A:
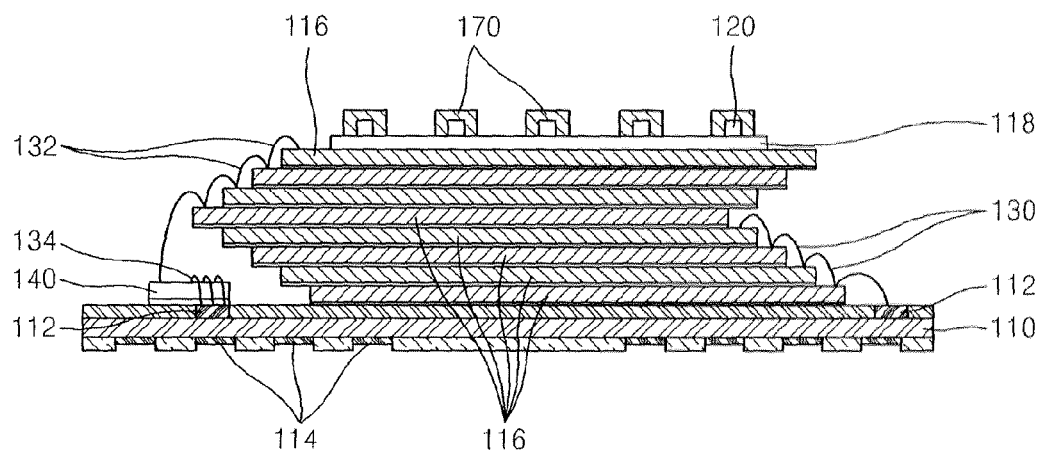
FIGS. 10A-10C are cross-sectional views illustrating the lower semiconductor package according to an exemplary embodiment of the present general inventive concept, in which a connection portion is formed using a release film.
Figure 10B:
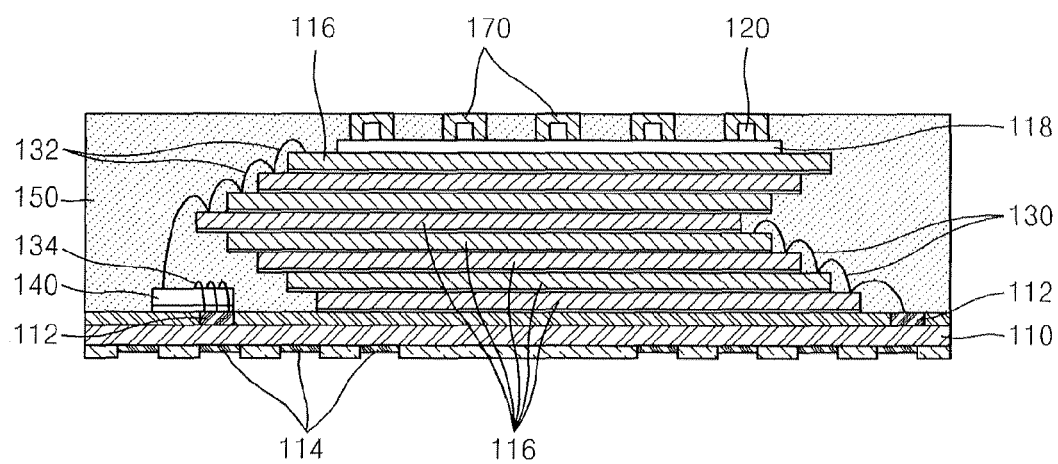
Figure 10C:
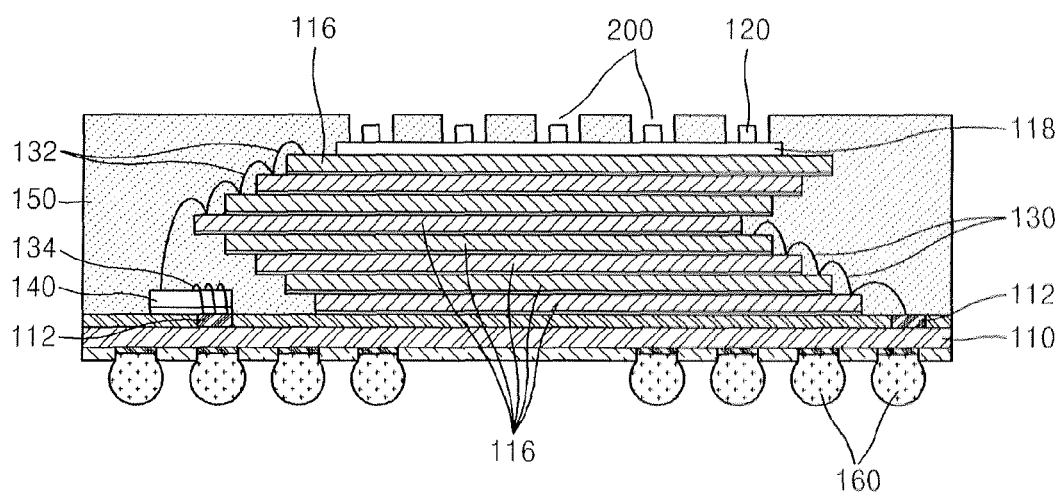

FIGS. 10A-10C are cross-sectional views illustrating the lower semiconductor package according to an exemplary embodiment of the present general inventive concept, in which a connection portion 200 is formed using a release film. The electrically-conductive lead 120 may be surrounded by the release film 170 as illustrated in FIG. 10A before the molding process is performed to encapsulate the lower semiconductor package in the encapsulation member 150. Then, the upper surface of the substrate 110 is encapsulated using the encapsulation member 150. As illustrated in FIG. 10B, an upper surface of the release film 170 is exposed from the upper surface of the encapsulation member 150. Next, as illustrated in FIG. 10C, after the molding is completed, the release film 170 is removed to form the connection portion 200 to expose the electrically-conductive lead 120.

Figure 11:
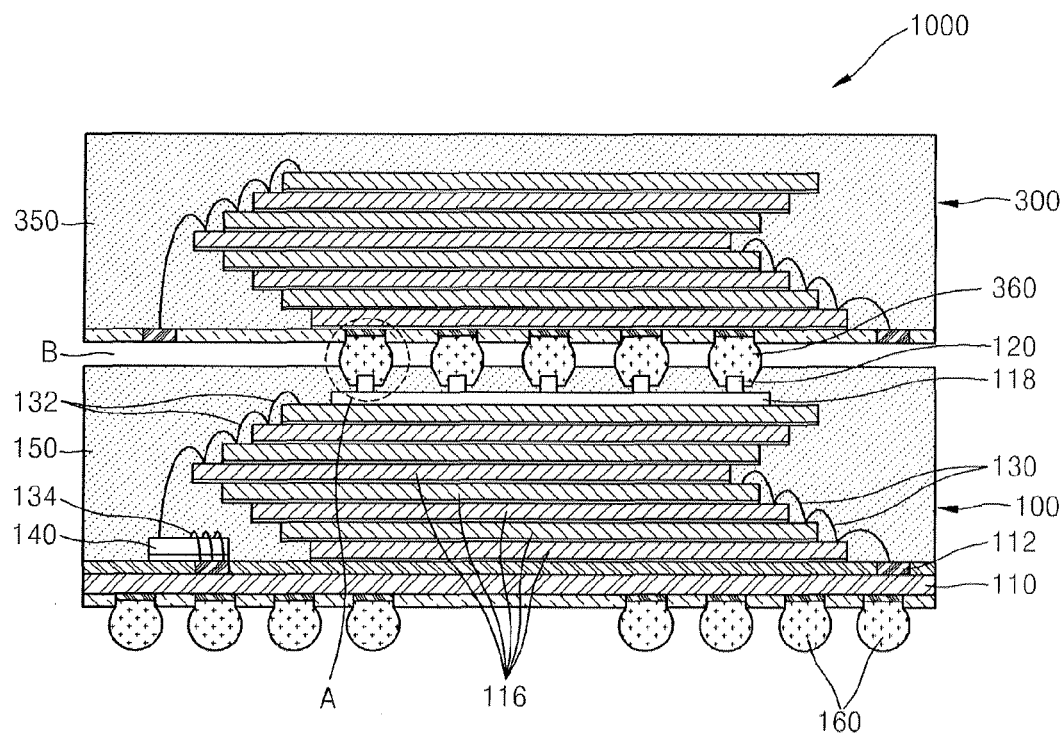
FIG. 11 is a cross-sectional view illustrating that an upper semiconductor package is mounted on the lower semiconductor package having the connection portion formed therein, according to an exemplary embodiment of the present general inventive concept.

FIG. 11 is a cross-sectional view illustrating that an upper semiconductor package is mounted on the lower semiconductor package having the connection portion 200 formed therein, according to an exemplary embodiment of the present general inventive concept. The upper semiconductor package 300 is mounted onto the lower semiconductor package 100 where the connection portion 200 is formed. To mount the upper semiconductor package 300 onto the lower semiconductor package 100, the solder ball 360 of the upper semiconductor package 300 is inserted into the connection portion 200 formed on the upper surface of the lower semiconductor package 100 so that the package-on-package 1000 having a fan-in structure may be formed. When a reflow process is performed with respect to a connection portion A, the solder ball 360 of the semiconductor package 300 is melted and thus connected to the electrically-conductive lead 120. A detailed structure thereof will be described in detail with reference to FIGS. 12-14. A process of filling the space B between the upper and lower semiconductor packages 300 and 100 using epoxy may be performed after connecting the upper and lower semiconductor packages 300 and 100.

Figure 12:
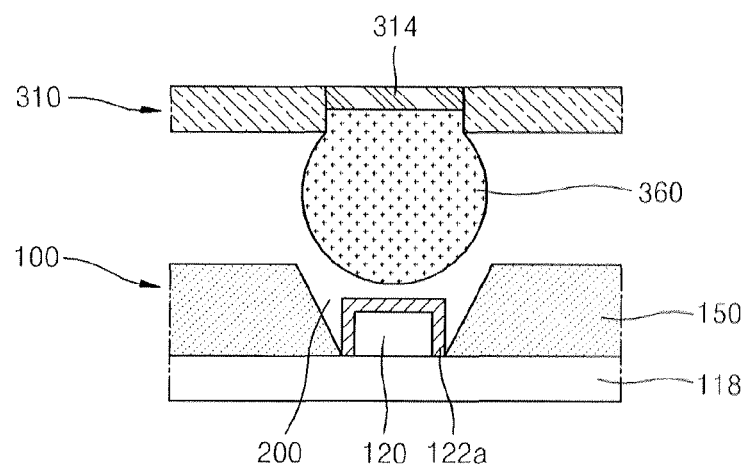
FIGS. 12-14 are cross-sectional views illustrating that a solder ball of the upper semiconductor package is connected to the connection portion of the lower semiconductor package, according to an exemplary embodiment of the present general inventive concept.
Figure 13:
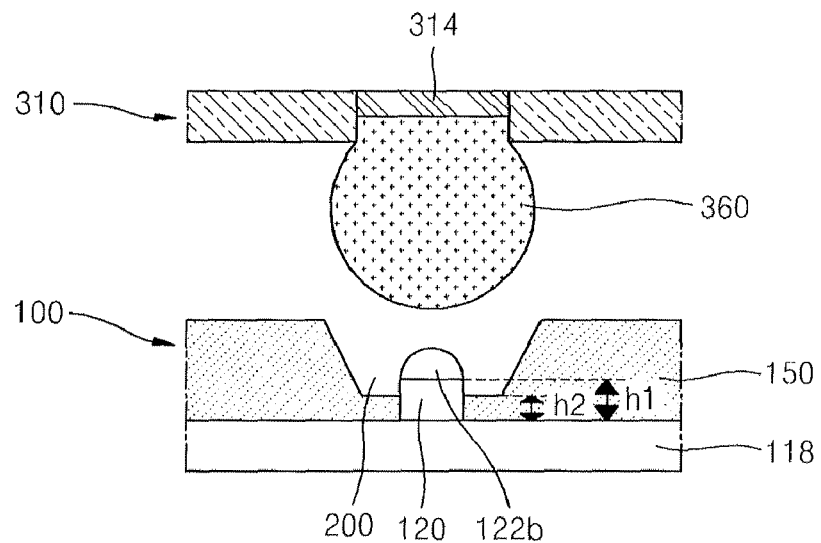

FIGS. 12-14 are cross-sectional views illustrating that a solder ball of the upper semiconductor package is connected to the connection portion of the lower semiconductor package, according to an exemplary embodiment of the present general inventive concept. Referring to FIG. 12, the substrate 310 of the upper semiconductor package 300 has an electrical connection pad 314, such as a solder ball pad. A solder ball 360 may be formed on the pad 314 at a location to correspond to the connection portion 200 of the lower semiconductor package 100. The connection portion 200 may be formed such that the electrically-conductive lead 120 may be completely exposed. A layer of solder 122a is plated on both the upper surface and the side surfaces of the electrically-conductive lead 120. Thus, when the solder ball 360 of the upper semiconductor package 300 is melted by the reflow process, the solder ball 360 may combine with the solder layer 122a to spread around the electrically-conductive lead 120. The solder layer 122a may also function as an etching stop layer when the encapsulation member 150 is etched using a laser.

Referring to FIG. 13, the solder 122b may be plated only on the upper surface of the electrically-conductive lead 120. In addition, when the connection portion 200 is formed, the recess may be formed to expose only a part of the electrically-conductive lead 120 may be exposed. In other words, if the electrically-conductive lead 120 has a height h1, then the portion of the connection portion 200 surrounding the electrically-conductive lead 120 may have a height h2 that is greater than zero, but less than the height h1. Accordingly, since the encapsulation member 150 surrounds a portion of the electrically-conductive lead 120 and the solder ball 360, the thermal stress due to a difference in a coefficient of thermal expansion between the encapsulation member 150 and a material to which the encapsulation member 150 is combined that is generated during the temperature cycle test may be absorbed.

Referring to FIG. 14, the connection portion 200 is formed to partially expose the electrically-conductive lead 120, and the electrically-conductive lead 120 does not have a solder layer on any of its surfaces. The solder ball 360 of the upper semiconductor package 300 may be melted in a reflow process to be directly connected to the electrically-conductive lead 120. Since the encapsulation member 150 surrounds the electrically-conductive lead 120 and the solder ball 360, the thermal stress generated during the temperature cycle test due to the difference in the coefficient of thermal expansion of a material to which the encapsulation member 150 is combined may be appropriately absorbed.

The electrically-conductive lead 120 may be configured to any appropriate shape and size. As shown in FIG. 14, the electrically-conductive lead 120 may have a height lower than an upper-most surface of the encapsulation layer 150. In other words, the difference between the height of the encapsulation layer 150 and the electrically conductive lead 120 may be a distance d1 that is a positive number greater than zero. As a consequence, before being melted in a reflow process, the solder ball 360 extends below the surface of the encapsulation layer 150 by the distance d1 to contact the electrically-conductive lead.

Figure 15A:
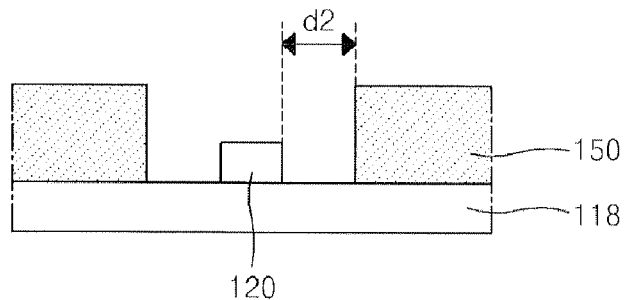
FIGS. 15A-15D illustrate conductive leads according to embodiments of the present general inventive concept.

FIGS. 15A-15D show configurations of the electrically-conductive lead 120 and the encapsulation layer 150. In FIG. 15A, the electrically-conductive lead 120 is mounted on the redistribution layer 118, and the encapsulation layer 150 is formed with a distance d2 between the encapsulation layer 150 and the electrically-conductive lead 120. In FIG. 15A, the distance d2 is a positive number, so that no portion of the electrically-conductive lead 120 contacts the encapsulation layer 150.

Figure 15B:
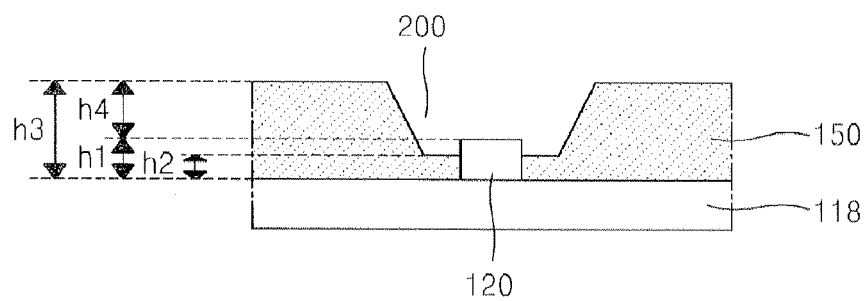

On the other hand, FIG. 15B illustrates an electrically-conductive lead 120 that contacts the encapsulation layer. As discussed previously with respect to FIG. 13, the portion of the redistribution layer 150 that contacts the electrically-conductive lead 120 may have a height h2, and the electrically-conductive lead 120 may have a height of h1. Since only a portion of the electrically-conductive lead 120 is surrounded by the encapsulation layer 150, h1 is a positive number greater than h2. The encapsulation layer 150, and the connection portion 200 formed in the encapsulation layer 150 may be formed to have a predetermined relationship with the electrically-conductive lead 120. For example, the encapsulation layer 150 may have a height h3 that is twice as high as the height h1 of the electrically-conductive lead 120. Alternatively, the height h4 of the connection portion 200 may be twice that of the exposed portion of the electrically-conductive lead 120 (represented by a height h1-h2).

Figure 15C:
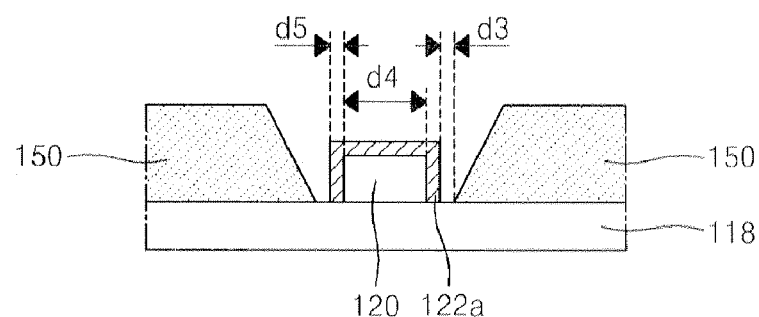

As illustrated in FIG. 15C, when the electrically-conductive lead 120 is coated on its sides by a solder layer 122a, the solder layer 122a may be separated from the encapsulation layer 150 by a distance d3. In addition, if the electrically-conductive lead 120 has a width d4, the solder layer 122a may have a width d5 that is substantially less than the width d4 of the electrically-conductive lead 120. For example, the solder layer 122a may have a width d5 that is one quarter or less than the width d4 of the electrically-conductive lead 120.

Figure 15D:
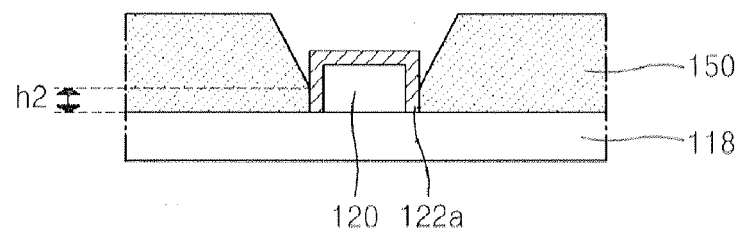

In FIG. 15D, the distance d3 between the solder layer 122a and the encapsulation layer 150 is zero, or in other words, the encapsulation layer 150 contacts a portion of the solder layer 122a. As discussed above, only a portion of the solder layer 122a may be surrounded by the encapsulation layer 150, and the encapsulation layer 150 may have a height h2 surrounding the solder layer 122a.

Figure 16A:
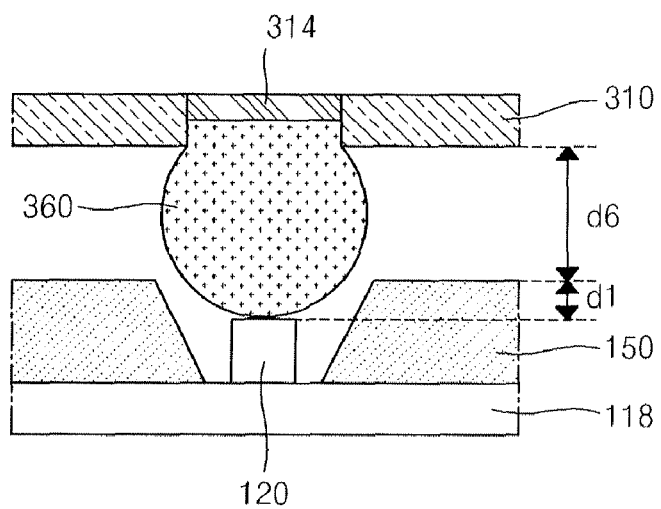
FIGS. 16A and 16B illustrate bonding a solder ball to a conductive lead according to an embodiment of the present general inventive concept.
Figure 16B:
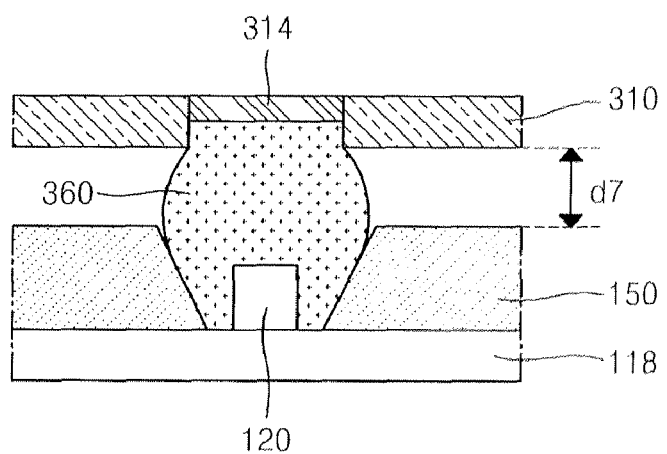

FIGS. 16A and 16B illustrate a process of melting a solder ball 360 onto the electrically-conductive lead 120. As illustrated in FIG. 16A, prior to melting, a lower-most part of the solder ball 360 of the upper semiconductor package 300 contacts the upper surface of the electrically-conductive lead 120 at a distance d1 below the upper-most surface of the encapsulation layer 150. The bottom surface of the substrate 310 of the upper semiconductor package is separated from the upper surface of the encapsulation layer 150 of the lower semiconductor package by a distance d6. The solder ball 360 may be formed on a connection pad 314 formed in the substrate 310. The electrically-conductive lead 120 may be formed on the redistribution layer 118.

Upon melting the solder ball 360, the bottom surface of the substrate 310 of the upper semiconductor package is separated from the upper surface of the encapsulation layer 150 of the lower semiconductor package by a distance d7 less than d6. In addition, the solder that makes up the solder ball 360 may melt to entirely surround the electrically-conductive lead 120. Thus, the stacked upper and lower semiconductor packages 300, 100 may be compact and may have secure electrical connections. In addition, since the solder ball 360 is formed in the connection portion 200, it is less likely to spread out on a surface of the encapsulation layer 150 or the upper substrate 310, and the package-on-package 1000 may be designed so that the solder balls 360 are located closer together.

Figure 17A:
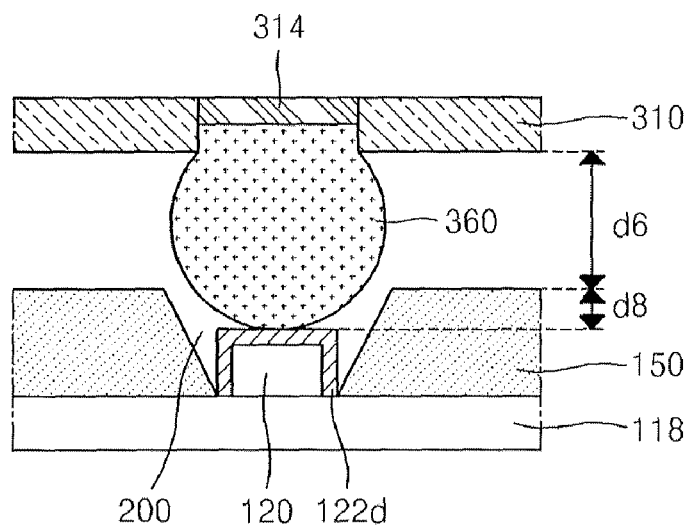
FIGS. 17A-17D illustrate bonding a solder ball to a conductive lead according to an embodiment of the present general inventive concept.
Figure 17B:
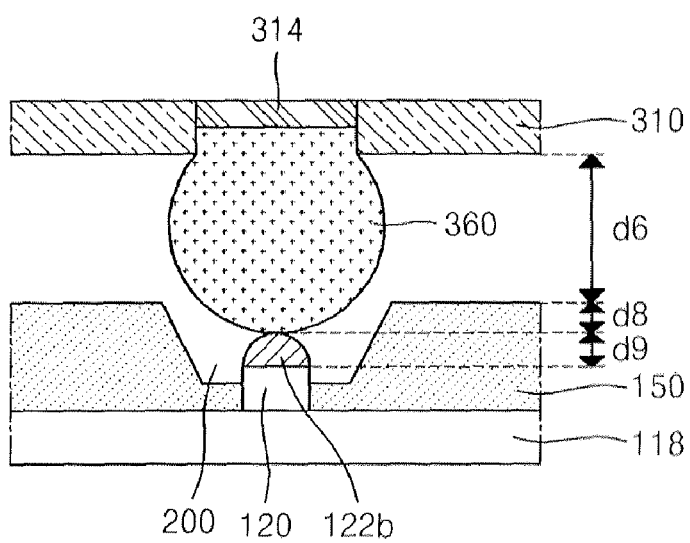

FIGS. 17A-17D illustrate a connection portion 200 connecting the upper semiconductor package 300 to the lower semiconductor package 100. FIG. 17A illustrates an electrically-conductive lead 120 having a solder layer 122a formed on its outer surfaces. FIG. 17B illustrates the electrically-conductive lead 120 having a solder layer 122b located only on its upper-most surface. The electrically-conductive lead is formed on a redistribution layer 118, and an encapsulation layer 150 is formed to cover the redistribution layer 118. A solder ball 360 is formed on a connection pad 314 of the substrate 310 of the upper semiconductor package 300.

The solder ball 360 contacts the upper surface of the solder layer 122a at a distance d8 beneath an upper surface of the encapsulation layer 150. As discussed previously with respect to FIGS. 14 and 16A, a distance between the upper-most surface of the electrically-conductive lead 120 and the upper-most surface of the encapsulation layer is a distance d1. Since the electrically-conductive lead 120 of FIGS. 17A and 17B include an additional solder layer 122a, 122b on the upper-most surface of the electrically-conductive lead 120, the distance d1 is greater than the distance d8. In other words, before melting, the solder ball 360 of FIGS. 17A and 17B may descend below an upper surface of the encapsulation layer 150 to a distance d8 that is less than a distance d1 defined as the distance from the upper surface of the electrically-conductive lead 120 to the upper surface of the encapsulation layer 150.

The electrically-conductive lead 120, the connection portion 200, and the solder layer 122a, 122b may be designed so that distances d1, d6, and d8 have any desired relationship. For example, the electrically-conductive lead 120 may have such a height h1 and the encapsulation layer 150 may have such a height h3 such that a quarter of the solder ball 360 is beneath an upper-most surface of the encapsulation layer 150 before the solder ball 360 is melted.

Figure 17C:
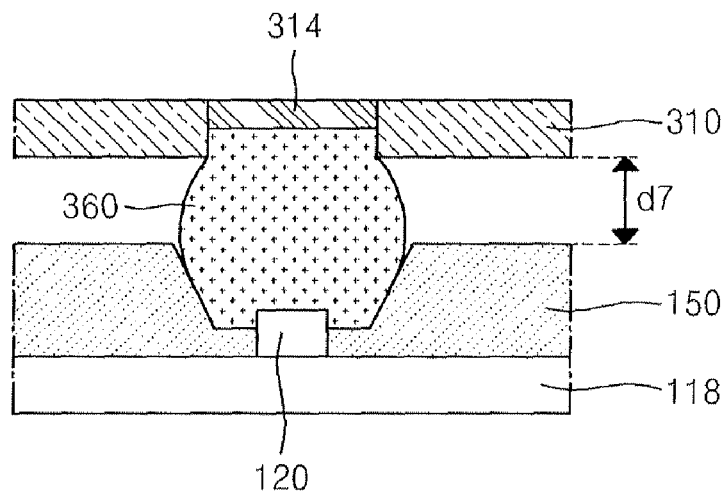
Figure 17D:
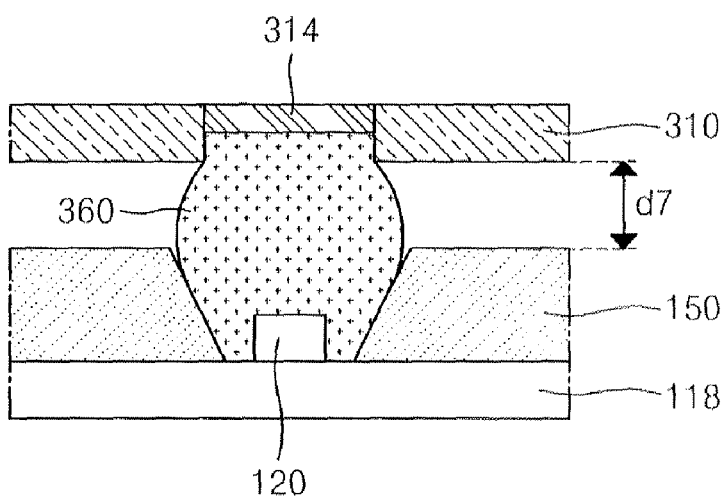

As illustrated in FIGS. 17C and 17D, after the solder ball 360 is melted, the solder layers 122a, 122b are also melted and may be physically, chemically, and/or electrically connected to the solder ball 360 to improve the electrical connection between the connection pad 314 and the electrically-conductive lead 120. In addition, since the melted solder of the solder ball 360 fills at least part of the connection portion 200, the lower surface of the substrate 310 moves closer to the upper surface of the encapsulation layer 150, so that the distance d7 separating the substrate 310 from the encapsulation layer 150 is less than the distance d6 separating the substrate 310 from the encapsulation layer 150 before melting the solder ball 360.

Figure 18A:
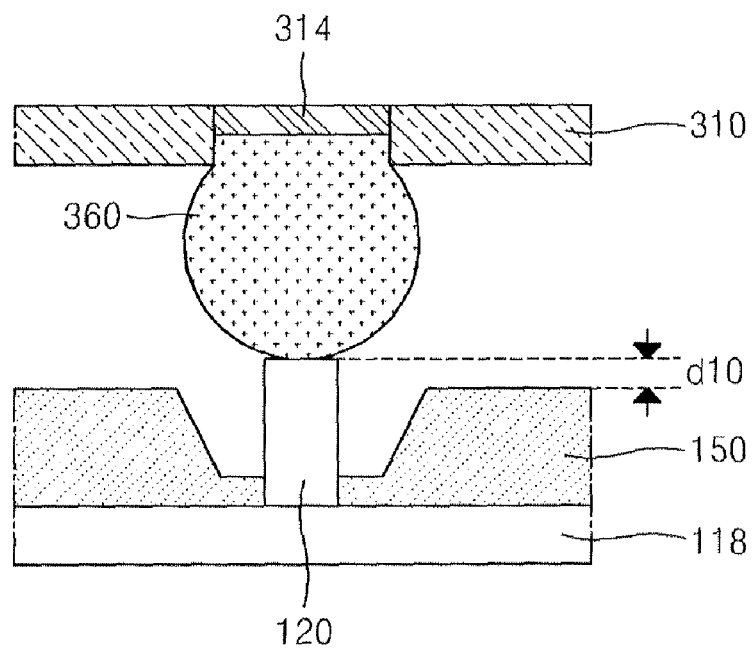
FIGS. 18A and 18B illustrate a conductive lead according to an embodiment of the present general inventive concept.
Figure 18B:
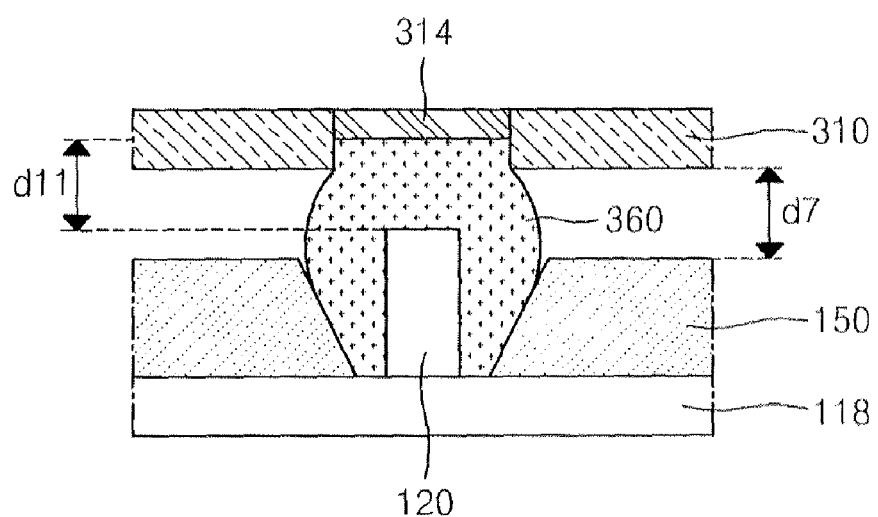

FIGS. 18A and 18B illustrate a connection portion 200 in which the electrically-conductive lead 120 has a height h1 higher than a height h3 of the encapsulating layer 150. In FIG. 18A, the solder ball 360 is connected to a connection pad 314 of the upper substrate 310. The bottom of the solder ball 360 is located a distance d10 from the upper surface of the encapsulation layer 150 before the solder ball 360 is melted. As illustrated in FIG. 18B, once the solder ball 360 is melted, the upper substrate 310 moves closer to the encapsulation layer 150 of the lower semiconductor package 100, and the electrically-conductive lead 120 is separated from the connection pad 314 by a distance d11. The distance d11 may be any desired value greater than zero, as long as the distance d7 separating the substrate 310 from the encapsulation layer 150 after melting the solder ball 360 is less than the height of the solder ball 360.

Figure 19:
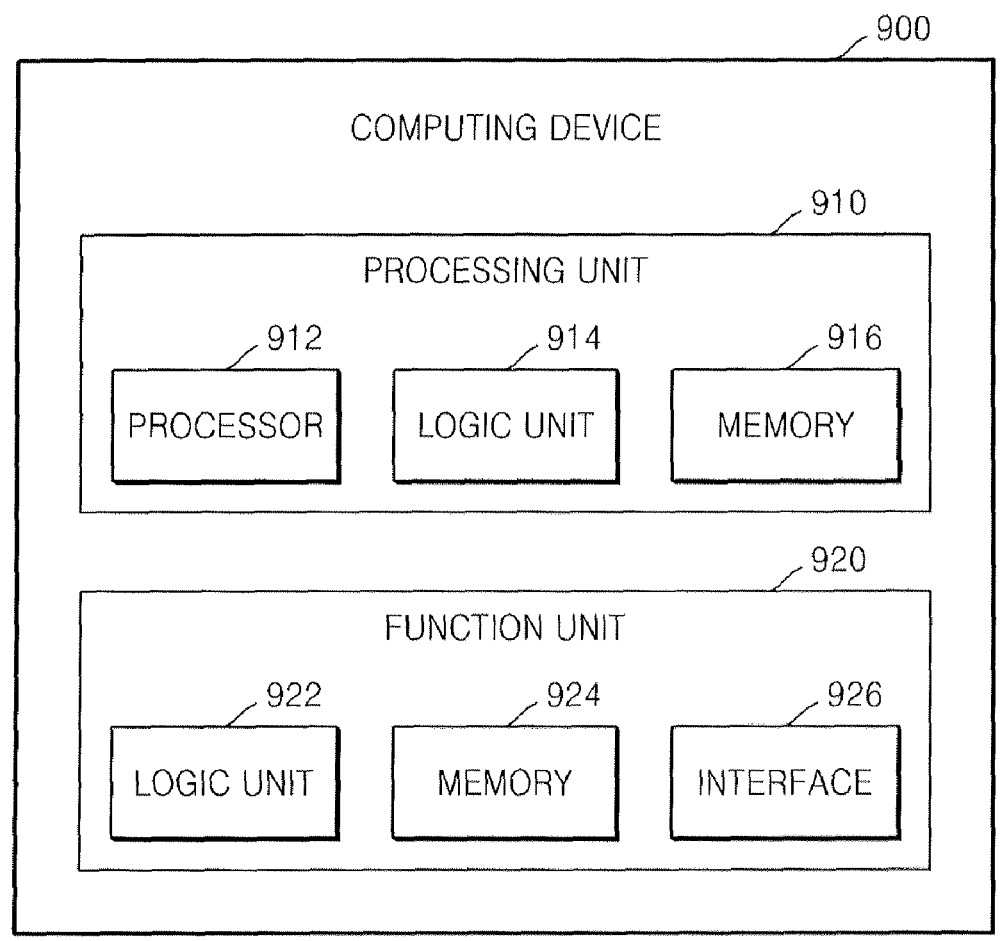
FIG. 19 illustrates a computing device according to the present general inventive concept.

FIG. 19 illustrates a computing unit 900 that may incorporate semiconductor packages according to embodiments of the present general inventive concept. The computing unit 900 may include a processing unit 910 and a function unit 920. The processing unit 910 may include a processor 912, logic units 914, and memory units 916, such as cache memory, for example. The function unit 920 may include logic units 922, memory 924, and an interface 926, for example. The interface 926 may include a user interface such as a keypad or touch-screen and an electronic interface, such as a wired or wireless data connection. Although the elements of the processing unit 910 and the function unit 920 are separate in FIG. 19, an element may be shared by both the processing unit 910 and the function unit 920. For example, a logic unit 914, 922 may be a single logic unit utilized by the processing unit 910 and the function unit 920.

In a computing unit 900, any of the semiconductor elements may include a package-on-package 1000 according to an embodiment of the general inventive concept. For example, the package-on-package 1000 may include at least one logic unit 914 an at least one memory chip 916 in the lower semiconductor package 100, and a plurality of stacked memory chips 924 in the upper semiconductor package 300. The logic unit 914 and memory 916 of the lower semiconductor package 100 may be electrically connected to the memory chips 924 of the upper semiconductor package 300 via the electrically-conductive leads 120 and solder balls 360, as discussed above.

The lower semiconductor package 100 may include a processor, or may be connected to a processor 912 or logic unit 914 via solder balls 160 on the lower surface of the lower substrate 110. The processor 912 may interact with the semiconductor chips 116 of the lower and upper semiconductor packages 100, 300 to manipulate data, read data from memory, and write data to memory, depending on the types of semiconductor devices that make up the semiconductor chips 116.

Thus, according to the present general inventive concept, since the upper semiconductor package and the lower semiconductor package of the package-on-package are connected in the fan-in structure, the generation of a connection defect of the upper and lower semiconductor packages due to a warping defect of the upper or lower semiconductor packages may be prevented.

Also, since the solder ball of the upper semiconductor package is buried in the encapsulation member of the lower semiconductor package, the overall height of the package-on-package may be reduced. As the height of the solder ball of the upper semiconductor package decreases, the pitch between the solder balls may be reduced. Accordingly, efficient design of the location of the solder balls may be achieved.

Also, since the solder ball of the upper semiconductor package is buried in the encapsulation member of the lower semiconductor package, the encapsulation member of the lower semiconductor package may function as a buffer layer absorbing stress due to a change in the temperature in the temperature cycle reliability test, for example. Accordingly, the solder junction reliability of the package-on-package may be improved by preventing the generation of a circuit pattern lift defect due to the stress by the change of temperature in the top semiconductor chip of the lower semiconductor package.

Also, after an electrical test to the upper and lower semiconductor packages is completed, two separate semiconductor packages that are quality products are connected to each other. Thus, the upper and lower semiconductor packages are vertically connected and thus the generation of an electrical defect in the upper and lower semiconductor packages may be prevented.

While the present general inventive concept has been particularly shown and described with reference to exemplary embodiments thereof, it will be understood that various changes in form and details may be made therein without departing from the spirit and scope of the following claims.

What is claimed is:

1. A package on package, comprising:
a lower semiconductor package including at least one semiconductor chip;
an encapsulation layer on an upper surface of the lower semiconductor package;
a conductive post on an upper surface of the lower semiconductor package, the conductive post having a height lower than an upper surface of the encapsulation layer; and
an upper semiconductor package connected to the conductive post of the lower semiconductor package via a first solder ball in a fan-in structure, such that a portion of a lower-most surface of the first solder ball that is connected to the conductive post and is in contact with the encapsulation layer is spaced from the upper surface of the lower semiconductor package.

2. The package on package of claim 1, wherein the lower semiconductor package comprises:
a substrate;
a plurality of semiconductor chips stacked on the substrate;
a pad redistribution pattern located on an upper-most surface of an upper-most semiconductor chip of the stacked semiconductor chips, the redistribution pattern including a connection terminal, and the conductive post being located on the connection terminal;
a wire connecting each of the plurality of semiconductor chips and the substrate;
the encapsulation member encapsulating the upper surface of the substrate, the plurality of semiconductor chips, and a portion of the conductive post; and
a second solder ball attached to a lower surface of the substrate.

3. The package on package of claim 2, wherein:
the plurality of semiconductor chips are stacked in a first direction,
each of a plurality of lower semiconductor chips is offset from each adjacent lower semiconductor chip in a second direction perpendicular to the first direction, and
each of a plurality of upper semiconductor chips is offset from each adjacent upper semiconductor chip in a third direction opposite the second direction.

4. The package on package of claim 2, wherein the lower semiconductor package further comprises a passive device mounted on the substrate and connected to the substrate by a wire.

5. The package on package of claim 1, wherein solder is plated on at least one of a side surface and an upper surface of the conductive post.

6. The package on package of claim 1, wherein a center portion of the conductive post is hollow.

7. The package on package of claim 1, wherein only a part of the conductive post is located outside the encapsulation layer.

8. The package on package of claim 1, wherein the entire conductive post is located outside the encapsulation layer.

9. The package on package of claim 1, wherein a part of the first solder ball of the upper semiconductor package is connected to the conductive post of the connection portion at a height lower than an upper-most surface of the encapsulation member of the lower semiconductor package.

10. The package on package of claim 1, further comprising an underfill filling a space between the lower semiconductor package and the upper semiconductor package.

* * * * *